US008824185B1

(12) United States Patent
Wang et al.

(10) Patent No.: US 8,824,185 B1
(45) Date of Patent: Sep. 2, 2014

(54) NOR-TYPE ROM WITH HIERARCHICAL-BL STRUCTURE, DYNAMIC SEGMENTATION SHIELDING, AND SOURCE PROGRAMMING

(71) Applicant: National Chung Cheng University, Chia-Yi County (TW)

(72) Inventors: Jinn-Shyan Wang, Chiayi (TW); Chao-Hsiang Wang, New Taipei (TW)

(73) Assignee: National Chung Cheng University, Chia-Yi (TW)

( * ) Notice: Subject to any disclaimer, the term of this patent is extended or adjusted under 35 U.S.C. 154(b) by 0 days.

(21) Appl. No.: 13/905,577

(22) Filed: May 30, 2013

(51) Int. Cl.
*G11C 17/00* (2006.01)
*G11C 16/04* (2006.01)
*G11C 16/24* (2006.01)

(52) U.S. Cl.
CPC ............ *G11C 16/0408* (2013.01); *G11C 16/24* (2013.01)
USPC ............................................ 365/104; 365/94

(58) Field of Classification Search
USPC ................................................... 365/94, 104
See application file for complete search history.

(56) References Cited

U.S. PATENT DOCUMENTS

2013/0279251 A1* 10/2013 Lee .......................... 365/185.03

* cited by examiner

*Primary Examiner* — Harry W Byrne
*Assistant Examiner* — Lance Reidlinger
(74) *Attorney, Agent, or Firm* — Muncy, Geissler, Olds & Lowe, P.C.

(57) ABSTRACT

A NOR-type ROM with hierarchical-BL structure, dynamic segmentation shielding, and source programming includes a plurality of bitcells forming a plurality of cell arrays, a plurality of WLs, a plurality of local bit lines LBLs electrically connected with the drains of the bitcells, a plurality of odd/even selection circuits electrically connected the LBLs that the bitcells in one of the cell array correspond to, a plurality of GBLs electrically connected the odd/even selection circuits that the bitcells in columns correspond to, and a plurality of odd-even precharge circuits electrically connected with the GBLs. The source of each bitcell is selectively grounded or floating according to the code-pattern.

3 Claims, 9 Drawing Sheets

NOR-TYPE ROM WITH HIERARCHICAL-BL STRUCTURE, DYNAMIC SEGMENTATION SHIELDING, AND SOURCE PROGRAMMING

BACKGROUND OF THE INVENTION

1. Field of the Invention

The present invention relates generally to integrated circuit (IC) memories and more particularly, to a NOR-type ROM with hierarchical-BL structure, dynamic segmentation shielding, and source programming.

2. Description of the Related Art

Read only memory (ROM), which have nonvolatile, high reliability, small area, high speed, and high compatibility, are commonly embedded in system on chips (SOCs) for storing a large number of fixed programs and data.

In recent years, there are three kinds of mask-programming ROM bit cell as recited below.

1. Filed Oxide Programming:

Such programming is applicable to NOR-type logic cell array for identifying whether an N-type metal-oxide-semiconductor (NMOS) field-effect transistor is produced in the process of oxidation of the substrate to serve as the manner of data recognition, providing higher operating speed in performance. Referring to FIG. 1, the black solid line 101 indicates a normal NMOS for providing discharging path to serve as data 0. On the contrary, the black dotted line 102 indicates none of any NMOS to serve as data 1. However, the mask programming belongs to the front-end engineering to be caught up with the manufacturing process too much, so the response time is longer and the regeneration rate is worse. In FIG. 1, WL denotes word line and BL denotes bit line.

2. Implantation Programming:

In such programming, the steps of the ion implantation process are doped with different concentrations or materials to result in change of the threshold voltage of the NMOS to further make the depletion-mode/enhancement-mode NMOS or the high-threshold-voltage/low-threshold-voltage NMOS to serve as the bitcell programming, wherein the high-threshold-voltage/low-threshold-voltage NMOS is preferably applicable to the NOR-type structure and the depletion-mode/enhancement-mode NMOS is preferably applicable to the NAND-type structure. Referring to FIG. 2, when the gate is low-voltage, the depletion-mode NMOS 201 will produce a channel for the bit line (BL) to discharge and meanwhile, the code-pattern is zero (0); in the meantime, the enhancement-mode NMOS 202 will cut off the channel to keep high and meanwhile, the code-pattern is one (1) for NAND programming. Such programming can produce flat cells without any contact to have better area benefit but to lose some speed and not all of manufacturing processes of standard complementary metal oxide semiconductor (CMOS) are supported.

3. Contact/Via/Metal Programming:

Such programming is based on the contact, via, or metal to determine whether the cell is connected to the BL for providing discharging path for the purpose of code-pattern and the operating speed is higher due to more current gain. In the circuit shown in FIG. 3(A) and the circuit layout shown in FIG. 3(B), a cell having a via between the BL and the NMOS is denoted by 301 and the other cell having no via is denoted by 302, wherein the two cells share one terminal (source) for grounding. However, encoding space must be reserved to the source and the source cannot be shared by other NMOSs, so the bit density is slightly higher. In cycle time of such programming, modifying mask approaches ultimate engineering, so the turn around time (TAT) is the shortest and the regeneration rate is highest to lead to optimal time to market. Thus, such programming is the mainstream of programming of the contemporary mask ROM.

As the manufacturing process develops, the interval between the BLs becomes shorter and the noise problem resulting from crosstalk has become non-ignorable. In recent years, crosstalk induce read failure (CIRF) has become attentive for some of memory structures to be studied and improved. Among the improved memory structures, three typical ones are recited below.

1. Dynamic Virtual Guardian (DVG) Technique:

Referring to FIG. 4(A), two of six clamped NMOSs 401-406 are put into each BL and controlled via column select signals. When BL[n] is selected, the column select signal activates the NMOS 407 for transmitting the signal to the sense amplifier SA and activates the clamped NMOSs 403, 406 located at two sides adjacent to the BL for making oscillations of the voltage at the two sides be held back by the clamped NMOSs under a high voltage to suppress coupled voltage drop to the BL. However, it is necessary to insert the clamped NMOSs additionally, so the required area is larger. Besides, direct current (DC) path is likely generated between the clamped NMOSs and the bitcell to result in a great amount of DC power consumption and to cause that the crosstalk holdback effect is deteriorated by logic intensity.

2. Content-Aware Design Framework:

Referring to FIG. 4(B), each BL is constituted by hierarchical segmentation framework. Column-oriented encoding based on algorithm and local BL switches (LBS) are applied to determine whether all are jointly connected to the BL to equalize the parasitic capacitance on each BL and to secure that self-capacitance suffices to hold back the interference resulting from the crosstalk. Besides, such framework needs a special algorithm, such as Code-structure Programming Algorithm, and the circuit also needs (1) a hybrid-segmented BL 432, (2) flag table 633, and (3) dual-path output drivers 634 to lower occurrence of excessive code-patterns of zero (0) so as to equalize the parasitic capacitance on the BL to further decrease the influence of the crosstalk. Such framework though can reduce the BL loading, but complicated code algorithm is needed to make the programming more difficult and it is necessary to additionally include the flag table and dual-path output drivers to lead to area penalty and power penalty. Besides, equalizing the parasitic capacitance can only reduce the degree of influence caused by the crosstalk and noise on the BL and cannot fully prohibit the crosstalk, so sensing margin can still be partially lost under low-voltage environment to further lower the immunity against the noise.

3. Dynamic Split Source Line (DSSL):

DSSL is an NAND-type ROM framework which is operable under the low-voltage (0.29V) environment and the working frequency of which can reach 3 MHz. As shown in FIG. 4(C), how the circuit of source is connected is done by odd and even and works with column address least significant bit (LSB) SL_sel 441 for control of source supplementary switch and for only providing discharging path for the source of strings, bits of which are accessed, where the adjacent BLs and sources of other strings are connected to high potential, thus solving the problems of crosstalk interference and current leakage. However, the access current of such framework, so low-voltage operating speed is quite limited. Besides, when the ROM capacity is increased, the number of cells that the LSB 441 is connected with at row direction increases, and NMOS of a source line (SL) driver needs to be very large to avoid bottleneck of access performance, thus bringing forth considerable additional area and power penalties.

As known from the above, none of any ROM framework having high stability and high speed without additional area penalty under low-voltage operation has been available to date.

The conventional ROM framework cannot be operated under low voltage, loses speed or stability under low-voltage operation or needs to pay additional area penalty.

SUMMARY OF THE INVENTION

The primary objective of the present invention is to provide a NOR-type ROM with hierarchical-BL structure, dynamic segmentation shielding, and source programming, which has high stability and high speed without additional peripheral circuit area penalty under low-voltage operation.

The foregoing objective of the present invention is attained by the NOR-type ROM having a plurality of bitcells, a plurality of WLs, a plurality of local bit lines (LBLs), a plurality of odd/even selection circuits, a plurality of global BLs (GBLs), and a plurality of odd-even precharge circuits. Each of the bitcells is an NMOS and a NOR-type ROM cell with source programming. The bitcells form a plurality of cell arrays, in each of which a plurality of bitcells are arranged in interleaving rows and columns. The BLs are electrically connected with the gate of the bitcells in such a way that one BL corresponds to one of the bitcells in rows. The LBLs are electrically connected with the drains of the bitcells in such a way that one LBL corresponds to one of the bitcells in columns. The odd/even selection circuits are electrically connected with the LBLs to which the bitcells correspond in one of the cell arrays in such a way that one odd/even selection circuit corresponds to one of the cell arrays for selecting the bitcells in odd or even columns. The GBLs are electrically connected with the odd/even selection circuits to which the bitcells in columns correspond in such a way that one GBL corresponds to one bitcell in column in at least one of the cell arrays. The odd/even precharge circuits are electrically connected with the GBLs, in such a way that one odd/even precharge circuit corresponds to at least one of the cell arrays, for passing through the odd/even selection circuits to precharge the bitcells in odd or even columns with electricity. The source of each bitcell is selectively grounded or floating according to the code-pattern.

DETAILED DESCRIPTION OF PREFERRED EMBODIMENTS

Structural features and desired effects of the present invention will become more fully understood by reference to a preferred embodiment given hereunder. However, it is to be understood that the embodiment is given by way of illustration only, thus are not limitative of the claim scope of the present invention.

Figure 1:
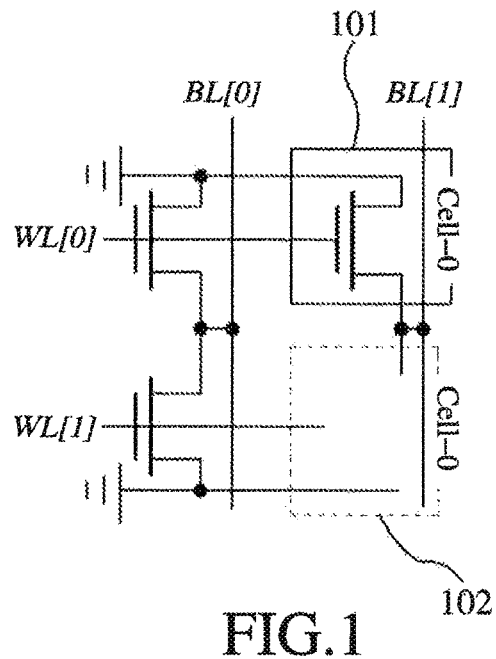
FIG. 1 is a circuit diagram of field oxide programming of a conventional bitcell.
Figure 2:
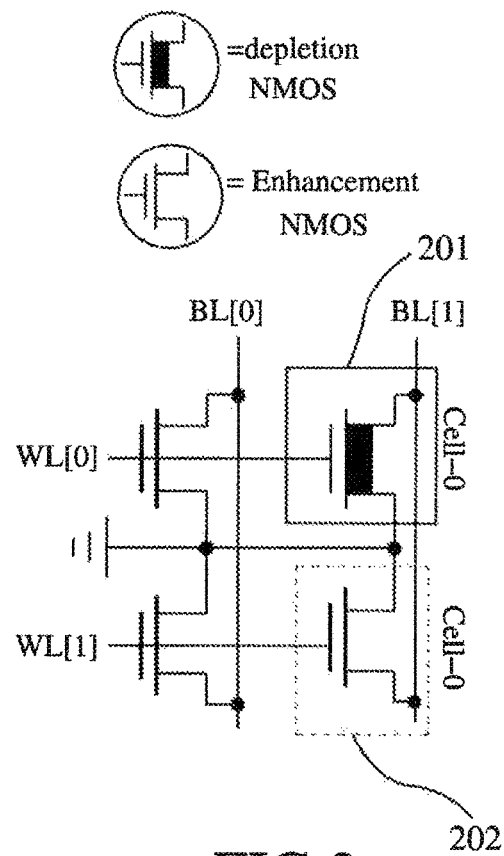
FIG. 2 is a circuit diagram of implantation programming of a conventional bitcell.
Figure 3A:
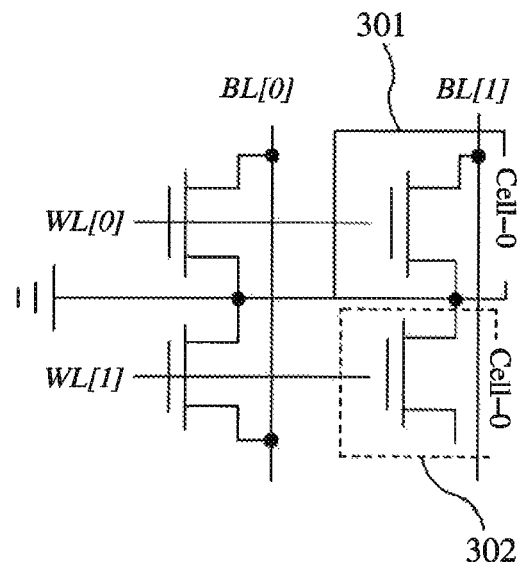
FIG. 3(A) is a circuit diagram of field oxide programming of a conventional bitcell.
Figure 3B:
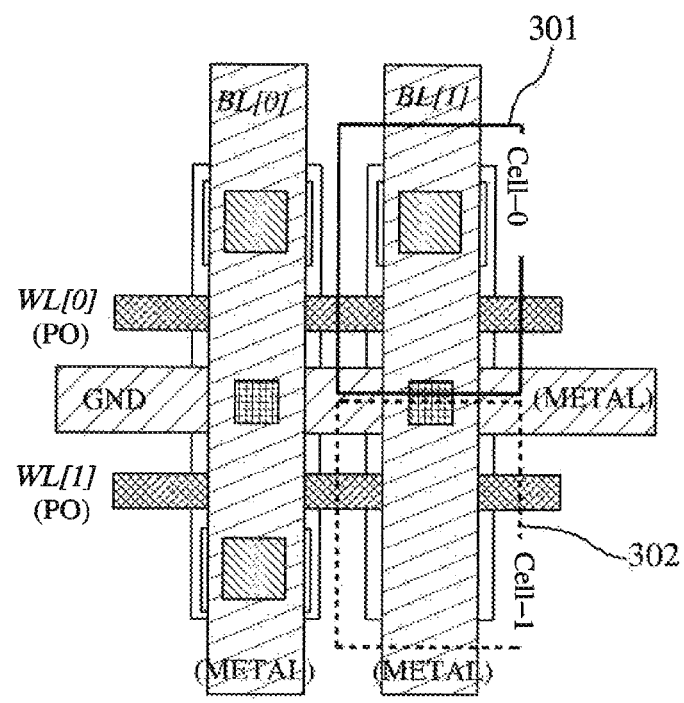
FIG. 3(B) is a circuit layout of field oxide programming of the conventional bitcell.
Figure 4A:
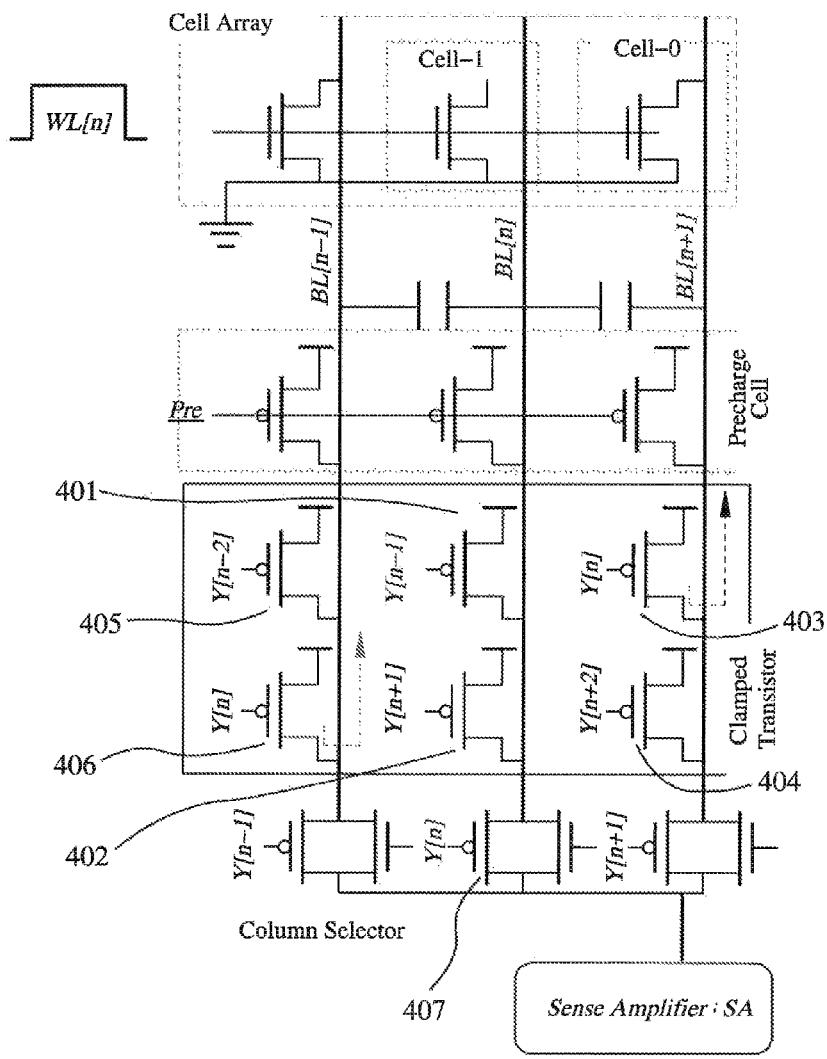
FIG. 4(A) is a circuit diagram of a conventional bitcell with DVG.
Figure 4B:
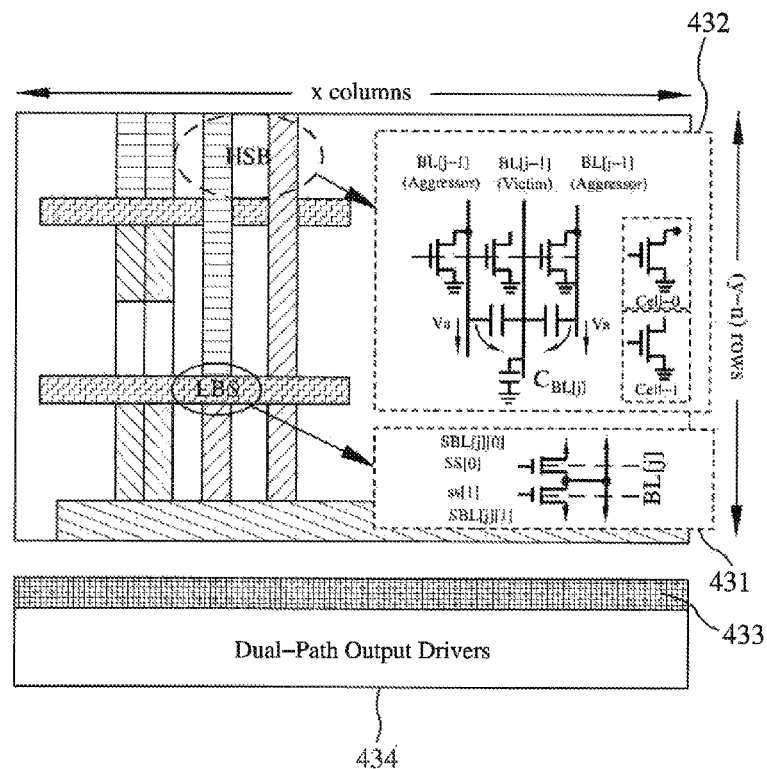
FIG. 4(B) is a schematic circuit diagram of a conventional bitcell with content-aware design framework.
Figure 4C:
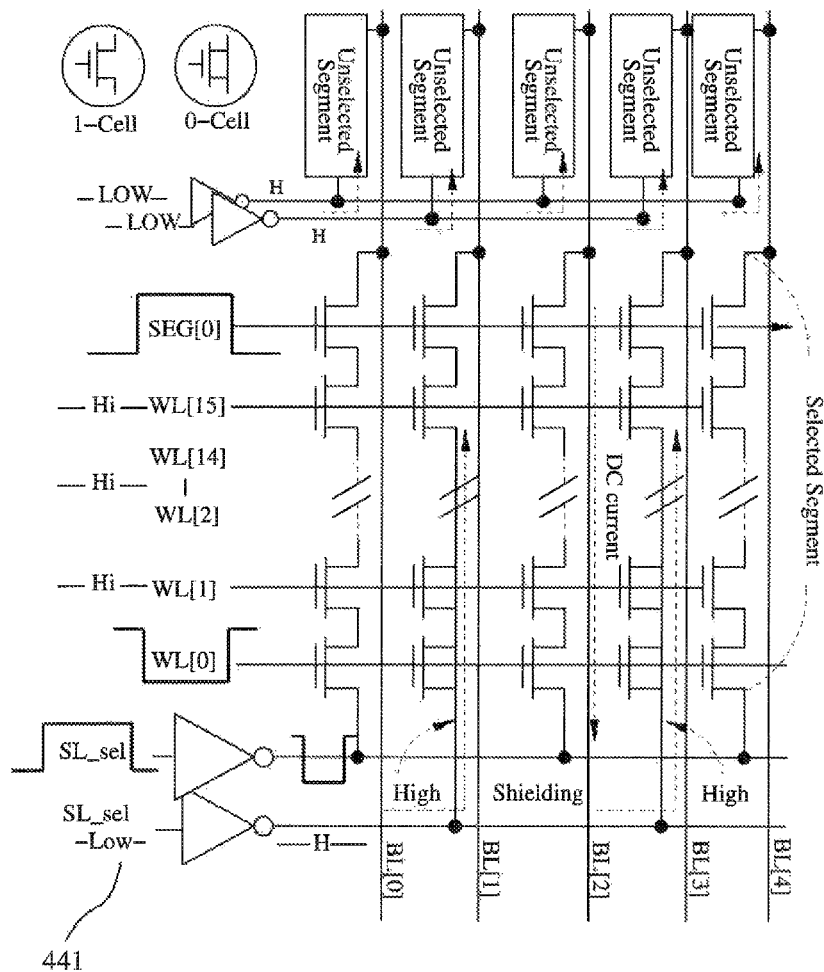
FIG. 4(C) is a circuit diagram of a conventional bitcell with DSSL.
Figure 5A:
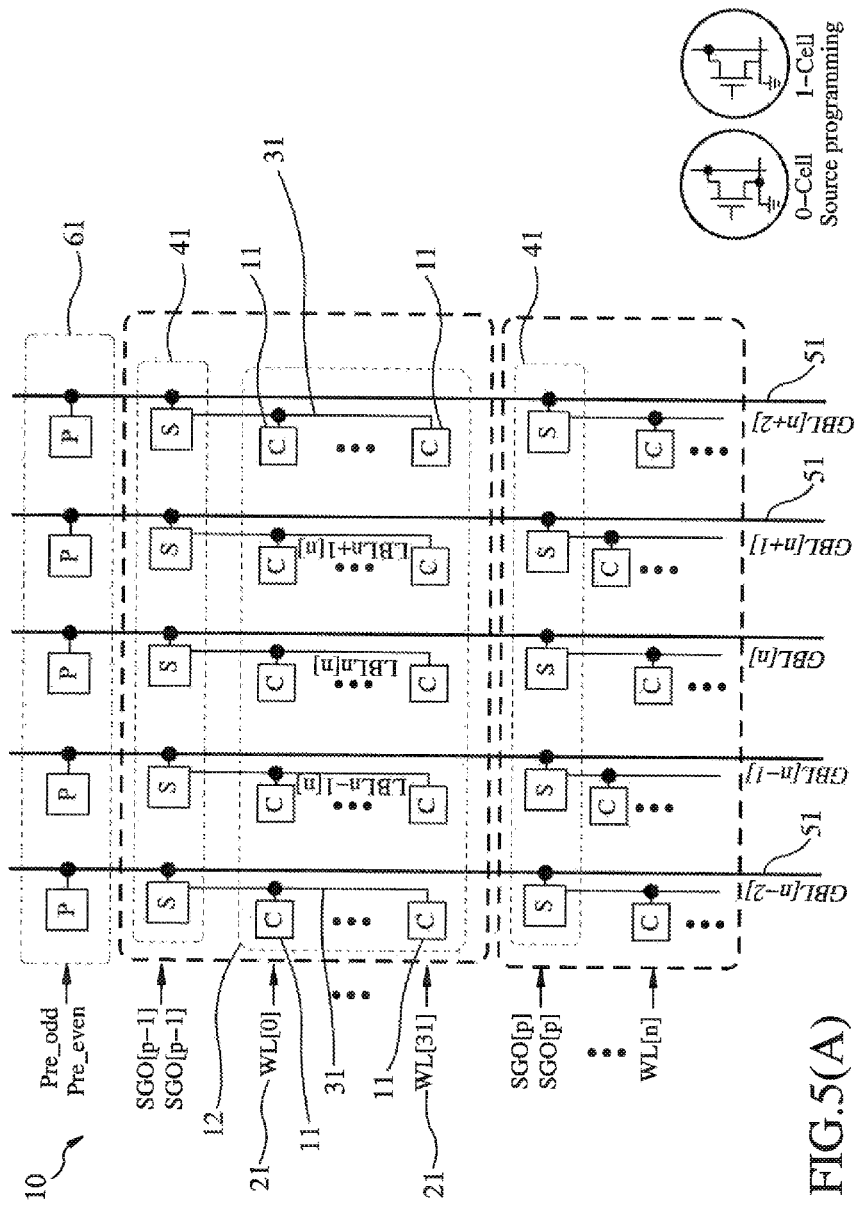
FIG. 5(A) is a block diagram of the present invention.
Figure 5B:
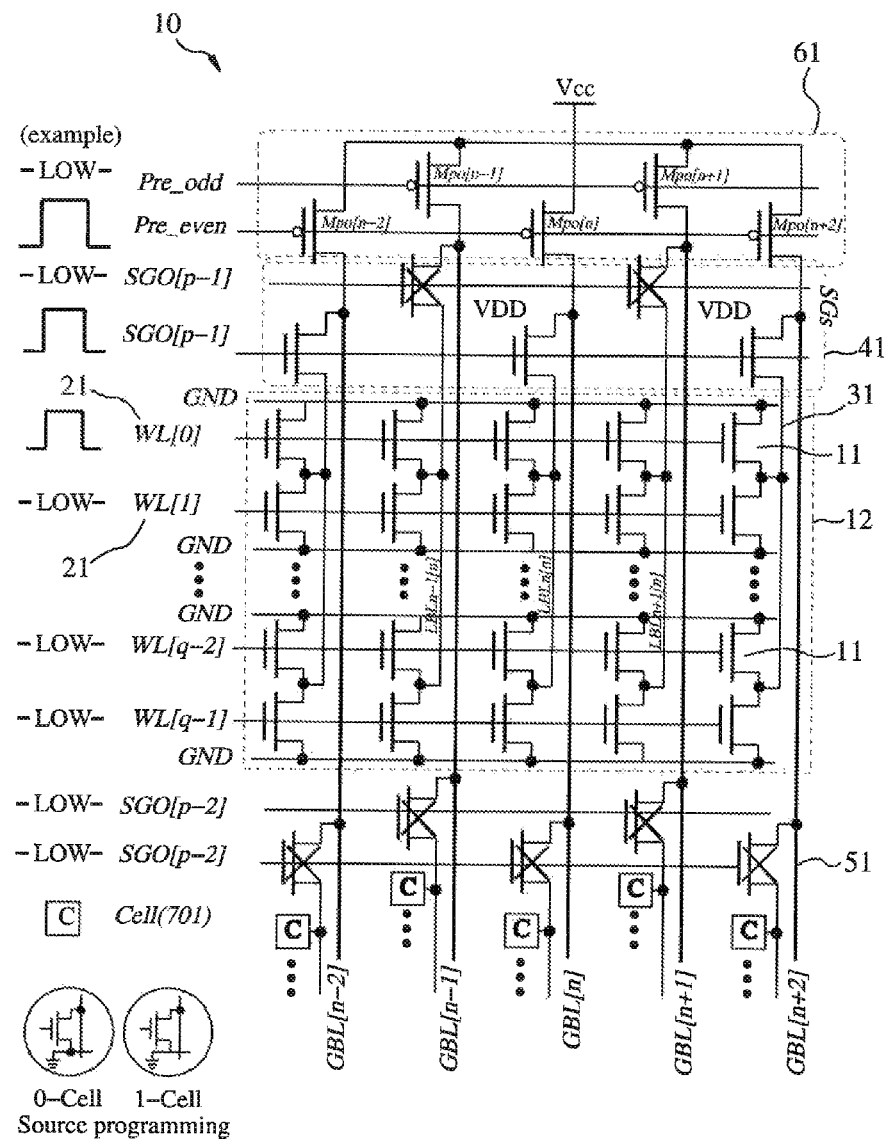
FIG. 5(B) is a circuit diagram of the present invention.

Referring to FIGS. 5(A) and 5(B), a NOR-type ROM 10 with hierarchical-BL structure, dynamic segmentation shielding, and source programming in accordance with a preferred embodiment of the present invention is formed of a plurality of bitcells 11, a plurality of WLs 21, a plurality of LBLs 31, a plurality of odd/even selection circuits 41, a plurality of GBLs 51, and a plurality of odd/even precharge circuits 61. The detailed descriptions and operations of these elements as well as their interrelations are recited in the respective paragraphs as follows.

Each of the bitcells 11 is an NMOS and a NOR-type ROM bitcell with source programming. The bitcells 11 form a plurality of cell arrays 12. In each of the cell arrays 12, a plurality of bitcells 11 are arranged in interleaving rows and columns.

The WLs 21 are electrically connected with the gates of the bitcells 11 respectively in such a way that one WL 21 corresponds to one row of the bitcell 11.

The LBLs 31 are electrically connected with the drains of the bitcells 11 respectively in such a way that one LBL 31 corresponds to of the bitcell 11 in one column.

The odd/even selection circuits 41 are electrically connected with the LBLs 31 to which the bitcells 11 of the cell arrays 12 correspond in such a way that one odd/even selection circuit 41 corresponds to one cell array 12. Each of the odd/even selection circuits 41 is formed of a plurality of NMOSs, each of which has its drain electrically connected with one of the LBLs 31, its source electrically connected with one of GBLs 51, and its gate which can be controlled by, for example, an external control signal. What are marked with "X" in FIG. 5(B) indicate the NMOSs or bitcells 11 which are not selected.

The GBLs 51 are electrically connected with the odd/even selection circuits 41 to which the bitcells 11 in the columns correspond in such a way that a GBL 51 corresponds to the bitcell 11 in one column.

The odd/even precharge circuits 61 are electrically connected with the GBLs 51, in such a way that one odd/even precharge circuit 61 corresponds to at least one of the cell arrays 12, for passing through the odd/even selection circuits 41 to precharge the bitcells 11 in odd or even columns with electricity. Each of the odd/even precharge circuits 61 is formed of a plurality of P-type metal-oxide-semiconductors (PMOSs), each of which has its drain electrically connected with one of GBLs 51, its source electrically connected with a power source VCC, and its gate which can be controlled by, for example, an external control signal.

The source of each bitcell 11 is selectively grounded or floating according to the code-pattern.

In light of the structure mentioned above, the odd/even selection circuits 41 mounted between the LBLs 31 and the GBLs 51 can make the GBLs 51 be segmentalized and hierarchized into the LBLs 31. For example, the number of the NMOSs that each GBL 51 corresponds to is W, let the GBLs 51 correspond to S-segment LBLs 31, and the number of the NMOSs that each LBL 31 corresponds to is G, so W=S×G; this is the hierarchic framework between the GBLs 51 and the LBLs 31.

Referring to FIG. 5(A) and FIG. 5(B), before read action proceeds, the odd/even precharge circuits 61 precharge the GBLs in odd and even columns with electricity. When the read action proceeds, the odd/even precharge circuits 61 are controlled to close the read GBLs 51 in odd and even columns and the other GBLs 51 which are not read remain precharged;

in the timing control, the corresponsive odd/even selection circuits 41 are activated first, the LBLs 31 are connected to the corresponsive GBLs 51, and the corresponsive bitcells 11 in rows are activated via the WLs 21, the data is transmitted to the corresponsive LBLs 31 to be further transmitted to the corresponsive GBLs 51. As for the other non-read bitcells 11, the odd/even selection circuits 41 are closed to prevent the data from transmitted to the GBLs 51 from the LBLs 31, and finally the data on the GBLs 51 can be sensed by a conventional sense amplifier.

Because the odd/even selection circuits 41 are mounted between the bitcells 11 and the odd/even precharge circuits 61 and the bitcells 11 in odd or even column are selected according to the odd-even concept, the oscillation of the adjacently bilateral GBLs 51 can be dynamically clamped to further resolve the CIRF. Besides, when the adjacently bilateral GBLs 51 are clamped, the odd/even selection circuits 41 can cut off the direct current (DC) path between the odd/even precharge circuits 61 and the bitcells 11, so the problems of DC power consumption and intense logic will not happen.

Moreover, the hierarchic framework between the GBLs 51 and the LBLs 31 can lower the number of NMOSs connected to the GBLs 51, thus reducing the loading capacitance and the power consumption. In the present invention, the selectors for hierarchizing the GBLs 51 and the LBLs 31 are the odd/even selection circuits 41, so not only the crosstalk and noise resulting from coupling can be counterchecked but the problems of the DC power consumption and logic intensity can be solved, reducing the BL parasitic capacitance, lowering the power consumption, and enhancing the read speed.

Figure 5C:
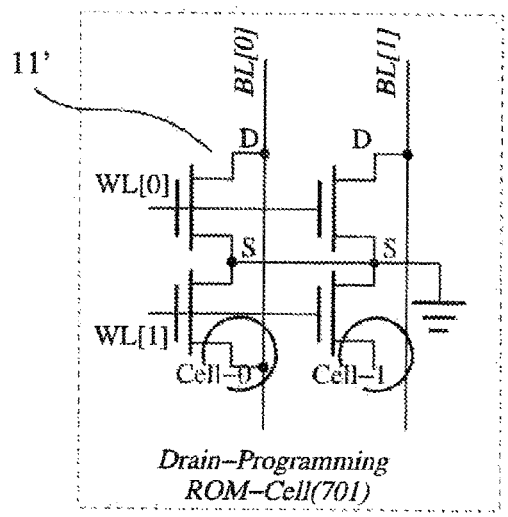
FIG. 5(C) is a circuit diagram of bitcell of ROM with drain programming.
Figure 5D:
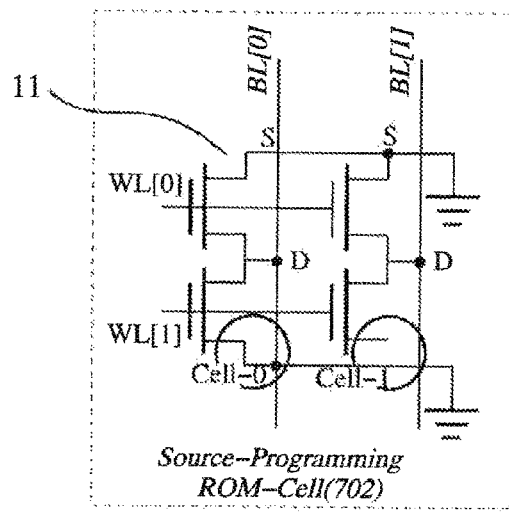
FIG. 5(D) is a circuit diagram of bitcell of ROM of the present invention with drain programming.

In addition, FIG. 5(C) illustrates the framework of bitcells 11 and drain programming. The bitcells 11 of the present invention is with source programming, as shown in FIG. 5(D), and can share the drain to be connected to the BL to decrease bit interval. As the source is grounded, in layout, the upper metallic layer can be connected with the bilateral metal, so the bit area of the framework with source programming is slightly smaller than that of the framework with the drain programming.

In addition to the aforesaid area effect, the bitcells with the source programming can further have the following advantages.

1. The bit area of the bitcell is slightly smaller to lower the BL length, so the parasitic resistance and capacitance on metallic wire can be reduced to increase the oscillation of the BL in the process of read to accelerate the read speed.

2. When the maximum number of the connected NMOSs on the metallic wire is reduced, the loading capacitance can be further reduced. The NMOSs share the drain to be connected to the BL, e.g. LBL, compared with the bitcell with the drain programming, under the circumstances that the BL is loaded the most seriously, e.g. provided there are 512 bitcells on the BL and all of the data are 0 and the ROM bitcell with the drain programming is connected to the maximum loading capacitance $512C_{Drain}$ of the BL, but the maximum loading capacitance that the ROM bitcell with the source programming is connected to the BL is $256C_{Drain}$ and the bitcell with the source programming shares the drain to be connected to the BL, so half of the loading of the BL can be saved under the most serious condition.

3. The ROM with the source programming makes the BL loading be not variable subject to different code-patterns, e.g. provided there are 512 bitcells on the BL and all of the data are 0 and the ROM bitcell with the drain programming is connected to the maximum loading capacitance $512C_{Drain}$ of the BL, but the ROM bitcell with the source programming is connected to the BL is $256C_{Drain}$; however, provided the data of the 512 bitcells are all 1, the maximum loading capacitance that the ROM bitcell with the drain programming is connected to is 0, but the maximum loading capacitance that the ROM bitcell with the source programming is connected to is still $256C_{Drain}$. The difference lies in the number of the NMOSs to which the BL is connected is fixed to uniform the BL loading and the oscillation of voltage in the process of reading the BL, so the sensing segments will not be different due to the code-pattern to make it easier to design the timing control of the rear-end sense magnifier and the peripheral control circuit.

Figure 6:
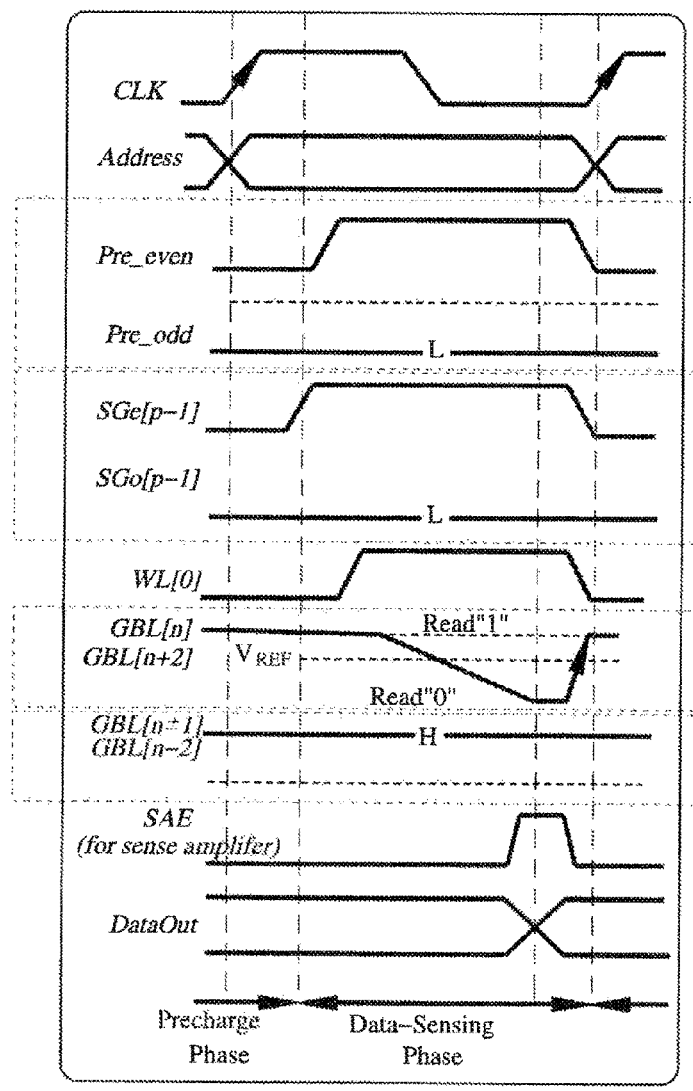
FIG. 6 is a control-timing diagram of the present invention.

In the process of control of the aforesaid framework, the timing is illustrated in FIG. 6 and FIG. 5(B). The control signals (Pre_even, Pre_odd) of the odd/even precharge circuits 61 in rows and the control signals (SGe, SGo) of the odd/even selection circuits 41 can be combined together. When the read action proceeds, the bilateral GBLs 51 (GBL[n±1]) of the read GBL 51 (GBL[n]) can be clamped into high potential as the signal of the odd/even precharge circuits 61 in odd columns is 0. Besides, the odd/even selection circuits 41 (SGo) in odd columns are closed, so the problem of DC power consumption will not happen and it is even not necessary to worry about that the potential clamped by the GBL 51 is vulnerable to the crosstalk.

What is claimed is:

1. A NOR-type ROM with hierarchical-BL structure, dynamic segmentation shielding, and source programming, the NOR-type ROM comprising:
   a plurality of bitcells, each of which is an N-typed metal-oxide-semiconductor (NMOS) and an NOR-type ROM bitcell with source programming and forms a plurality of cell arrays, each of which is formed of a plurality of bitcells arranged in interleaving rows and columns;
   a plurality of word lines (WLs) electrically connected to gates of the bitcells in a way that one WL corresponds to the bitcell in one row;
   a plurality of local bit lines (LBLs) electrically connected with drains of the bitcells in a way that one LBL corresponds to the bitcell in one column;
   a plurality of odd/even selection circuits electrically connected with the LBLs to which the bitcells in one of the cell arrays correspond, in a way that one odd/even selection circuit corresponds to one of the cell arrays, for selecting the bitcells in odd or even columns;
   a plurality of global bit lines (GBLs) electrically connected with the odd/even selection circuits to which the bitcells in columns correspond in a way that one GBL corresponds to one bitcell in column in at least one of the cell arrays; and
   a plurality of odd/even precharge circuits electrically connected with the GBLs, in a way that one odd/even precharge circuit corresponds to at least one of the cell arrays, for passing through the odd/even selection circuits to precharge the bitcells in odd or even columns with electricity;
   wherein the sources of the bitcells are selectively grounded or floating according to a code-pattern.

2. The NOR-type ROM as defined in claim 1, wherein each of the odd/even selection circuits is formed of a plurality of NMOSs, each of which has its drain electrically connected with one of the LBLs, its source electrically connected with one of the GBLs, and its gates under control.

3. The NOR-type ROM as defined in claim 1, wherein each of the odd/even precharge circuits is formed of a plurality of NMOSs, each of which has its drain electrically connected with one of the GBLs, its source electrically connected with a power source, and its gate under control.

* * * * *